(12) United States Patent
Lorz

(10) Patent No.: US 11,385,262 B2
(45) Date of Patent: Jul. 12, 2022

(54) MEASURING SHUNT

(71) Applicant: Siemens Aktiengesellschaft, Munich (DE)

(72) Inventor: Roland Lorz, Röttenbach (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 17/295,780

(22) PCT Filed: Nov. 25, 2019

(86) PCT No.: PCT/EP2019/082391
§ 371 (c)(1),
(2) Date: May 20, 2021

(87) PCT Pub. No.: WO2020/114818
PCT Pub. Date: Jun. 11, 2020

(65) Prior Publication Data
US 2022/0011348 A1    Jan. 13, 2022

(30) Foreign Application Priority Data

Dec. 7, 2018 (EP) ..................... 18211063

(51) Int. Cl.
G01R 15/14 (2006.01)
H02M 1/00 (2006.01)
G01R 1/20 (2006.01)
G01R 17/10 (2006.01)

(52) U.S. Cl.
CPC ........... *G01R 15/146* (2013.01); *G01R 1/203* (2013.01); *G01R 17/10* (2013.01); *H02M 1/0009* (2021.05)

(58) Field of Classification Search
CPC ...... G01R 15/146; G01R 1/203; G01R 17/10; H02M 1/0009
See application file for complete search history.

(56) References Cited

U.S. PATENT DOCUMENTS

| 5,451,865 | A | * | 9/1995 | Coburn | ................ G01R 15/146 |
| | | | | | 324/127 |
| 8,837,118 | B2 | * | 9/2014 | McGrail | ................. H01F 38/30 |
| | | | | | 361/663 |
| 2008/0074225 | A1 | | 3/2008 | Hansen et al. | |

(Continued)

FOREIGN PATENT DOCUMENTS

DE    10 2006 039 722 A1    2/2008

OTHER PUBLICATIONS

PCT International Search Report and Written Opinion of International Searching Authority dated Sep. 3, 2020 corresponding to PCT International Application No. PCT/EP2019/082391 filed Nov. 25, 2019.

(Continued)

*Primary Examiner* — Akm Zakaria
(74) *Attorney, Agent, or Firm* — Henry M. Feiereisen LLC

(57) ABSTRACT

A measuring shunt includes a resistance element and a magnetic core. The resistance element includes two main contacts and a middle section extending between the main contacts for conducting an electrical current between the two main contacts through the middle section. The magnetic core extends in an annular manner around the middle section of the resistance element.

15 Claims, 2 Drawing Sheets

(56) References Cited

U.S. PATENT DOCUMENTS

| | | | | |
|---|---|---|---|---|
| 2012/0086430 A1* | 4/2012 | Marten | ............. | G01R 19/0092 |
| | | | | 324/76.11 |
| 2014/0292458 A1 | 10/2014 | Andres et al. | | |
| 2015/0253412 A1* | 9/2015 | Jost | ........................ | G01R 35/00 |
| | | | | 324/202 |
| 2015/0303808 A1 | 10/2015 | Ryotaro et al. | | |
| 2021/0048454 A1* | 2/2021 | Choi | .................... | G01R 15/202 |

OTHER PUBLICATIONS

Ziegler S et al: "Current Sensing Techniques: A Review", IEEE Sensors Journal, IEEE Service Center, New York, NY, US, vol. 9, No. 4, pp. 354-376, XP011252969, ISSN: 1530-437X; pp. 356, left column, paragraph 1; figure 4; 2009.

\* cited by examiner

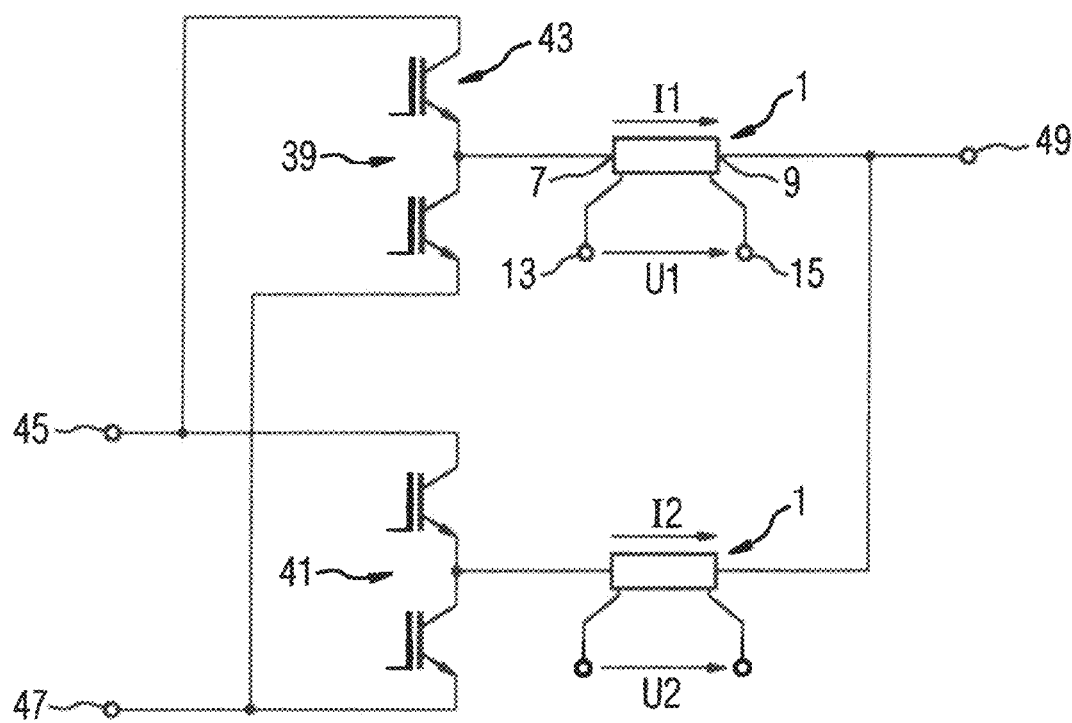
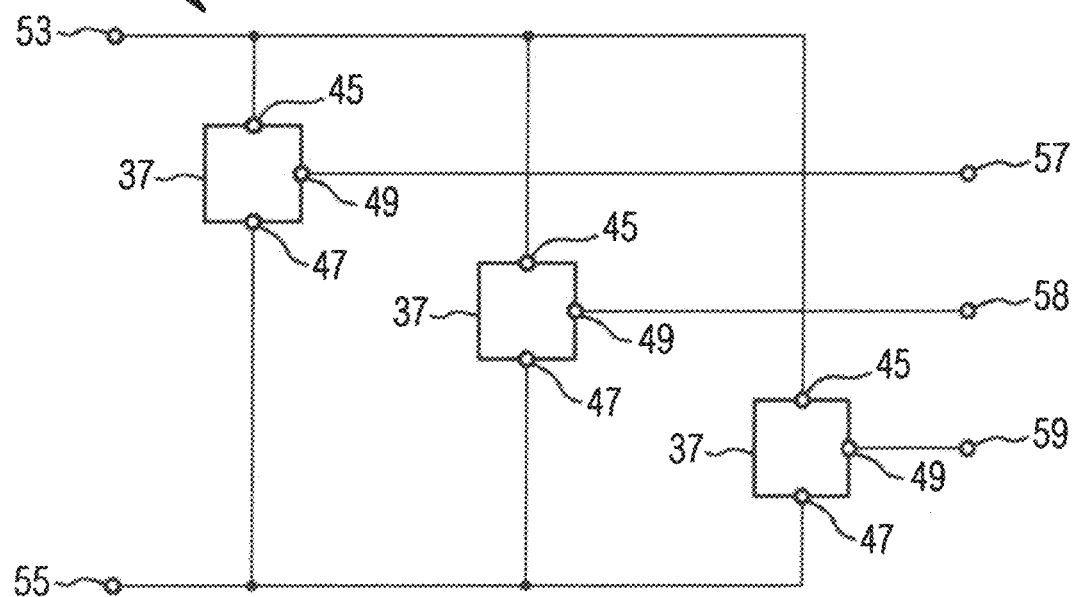

MEASURING SHUNT

CROSS-REFERENCES TO RELATED APPLICATIONS

This application is the U.S. National Stage of International Application No, PCT/EP2019/082391, filed Nov. 25, 2019, which designated the United States and has been published as International Publication No. WO 2020/114818 and which claims the priority of European Patent Application, Serial No. 18211063.5, filed Dec. 7, 2018, pursuant to 35 U.S.C. 119(a)-(d).

BACKGROUND OF THE INVENTION

The invention relates to a measuring shunt, in particular for circuit arrangements with parallel-connected half-bridges of electronic switches and power converters with circuit arrangements of this type.

Parallel connections of half-bridges of electronic switches are used in particular in power converters to achieve a satisfactory power converter performance. In parallel connections of this type, electronic switches are arranged spatially closely adjacent, as a result of which the electronic switches are coupled. Inductances can be used to decouple the electronic switches, but for reasons of cost they are frequently dispensed with. One reason for employing measuring shunts in power converters is to measure phase currents, for example for speed control of motors driven via power converters.

US 2008/074225 A1 discloses an inductor with an inductor body. A cavity extends through the inductor body between two opposing end surfaces of the inductor body. A thermally stable resistance element extends through the cavity, faces an upper surface of the inductor body and has surface-mountable terminals.

US 2014/292458 A1 discloses a magnetic device with a magnetic core and a conductive winding inductively coupled to the magnetic core. The conductive winding includes a first terminal segment, a second terminal segment, and an inductive segment electrically coupled in series between the terminal segments. The first terminal segment includes a current sensing element.

The object of the invention is to specify an improved measuring shunt, in particular for circuit arrangements with parallel-connected half-bridges of electronic switches and power converters with such circuit arrangements.

SUMMARY OF THE INVENTION

The object is achieved according to the invention by a measuring shunt, as set forth hereinafter, a circuit arrangement as set forth hereinafter, and a power converter as set forth hereinafter.

Advantageous embodiments of the invention are the subject matter of the subclaims.

A measuring shunt according to the invention comprises a resistance element with two main contacts and a middle section extending between the main contacts for conducting an electric current between the two main contacts through the middle section. The measuring shunt further has a magnetic core which extends in an annular manner around the middle section of the resistance element.

The magnetic core extending around the resistance element imparts to the measuring shunt an inductance that can be used to decouple electronic switches in half-bridges connected in parallel. The measuring shunt according to the invention hence enables not only current measurement but also the decoupling of electronic switches in half-bridges connected in parallel. A measuring shunt according to the invention additionally enables asymmetries and voltage gradients at the outputs of half-bridges connected in parallel to be limited thanks to the filter effect of its inductance. As a result, the functionality of the measuring shunt is advantageously increased.

The measuring shunt additionally has two auxiliary contacts to tap a measurement voltage which drops between two measurement points of the resistance element located on different sides of the magnetic core. This aspect of the invention enables an improvement in the measuring accuracy of the measuring shunt thanks to a four-wire measurement in which a current flowing through the resistance element is measured using a measurement voltage that is tapped at the auxiliary contacts.

One of the auxiliary contacts extends from one of the measurement points through the magnetic core. This prevents the measurement voltage tapped at the auxiliary contacts from containing a voltage that is induced by the magnetic core and falsifies the measurement signal.

The middle section of the resistance element is embodied as U-shaped. This means the measuring shunt can easily be arranged with the main contacts on a flat circuit carrier.

One embodiment of the invention provides that the magnetic core consists of two core parts joined together. This embodiment of the invention enables easy mounting of the magnetic core around the resistance element by joining the two core parts.

Another embodiment of the invention provides that the magnetic core is spaced apart from the resistance element by an air gap. Due to the air gap, an inductance of the measuring shunt can advantageously be influenced.

An alternative embodiment of the invention to the two aforementioned embodiments provides that the magnetic core is injection-molded around the middle section of the resistance element. This embodiment of the invention enables simple series production of the measuring shunt by injection-molding of the magnetic core.

The magnetic core is preferably manufactured from a material with a high magnetic permeability, a high saturation magnetization and/or low frequency-dependent magnetic losses. For example, the magnetic core is manufactured from iron or a ferrimagnetic material. If the magnetic core is injection-molded, it is manufactured for example from a mixture of a carrier material, for example a plastic, and a magnetic material, for example a magnetic powder such as iron powder or a ferrimagnetic powder.

The resistance element is preferably manufactured from a material which has a low specific electrical resistance and a low temperature dependency of its electrical resistance. For example, the resistance element is manufactured from a copper-nickel-manganese alloy.

A circuit arrangement according to the invention has at least two half-bridges connected in parallel, in each of the bridge arms of which at least one electronic switch is arranged, wherein a measuring shunt according to the invention is arranged in the bridge arm of each half-bridge. The measuring shunts can be used on the one hand to measure the currents flowing in the bridge arms and on the other hand to decouple the half-bridges connected in parallel without having to use additional components. In addition, the filter effect of the measuring shunt limits a voltage gradient at the output of the circuit arrangement.

A power converter according to the invention has at least one inventive circuit arrangement of parallel-connected half-bridges with electronic switches. The advantages of a power converter such as this emerge from the aforementioned advantages of a circuit arrangement according to the invention.

BRIEF DESCRIPTION OF THE DRAWING

The above-described characteristics, features and advantages of this invention, as well as the manner in which these are realized, will become more clearly and easily intelligible in connection with the following description of exemplary embodiments which are explained in more detail with reference to the drawings, in which:

FIG. 3 shows a circuit arrangement with two parallel-connected half-bridges of electronic switches, FIG. 4 shows a circuit diagram of a power converter.

DETAILED DESCRIPTION OF PREFERRED EMBODIMENTS

Figure 1:
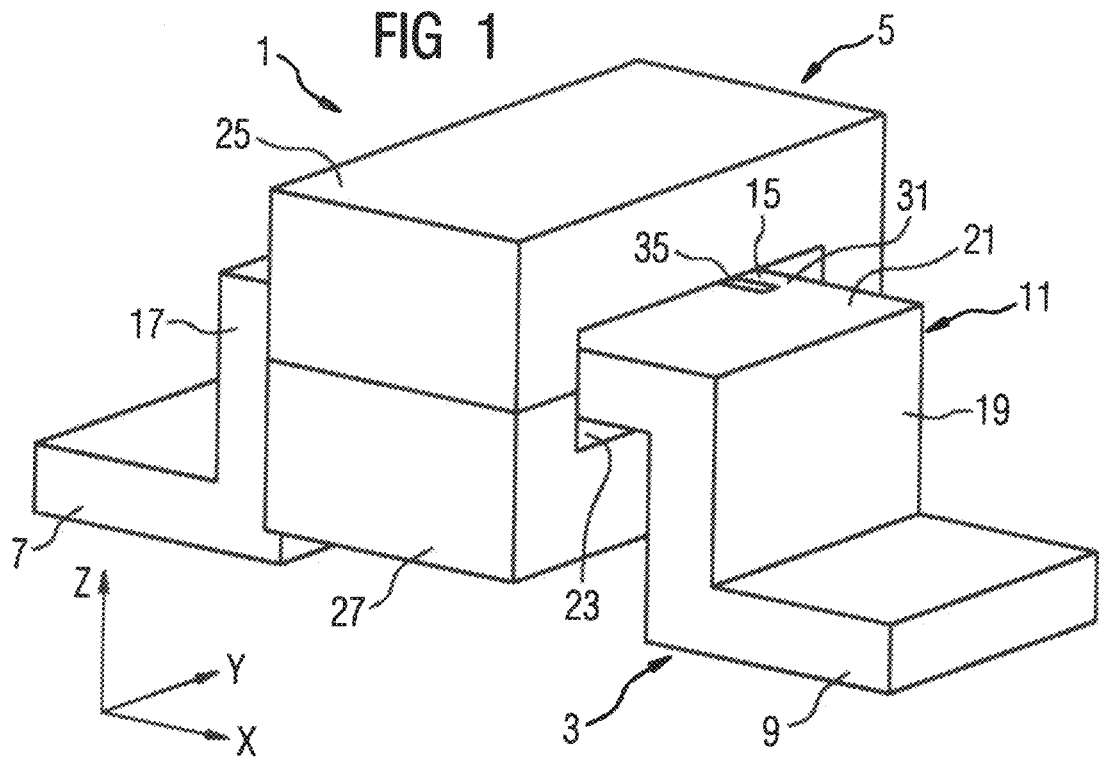
FIG. 1 shows a first perspective representation of a measuring shunt.

Parts which correspond to one another are provided with the same reference characters in the figures.

Figure 2:
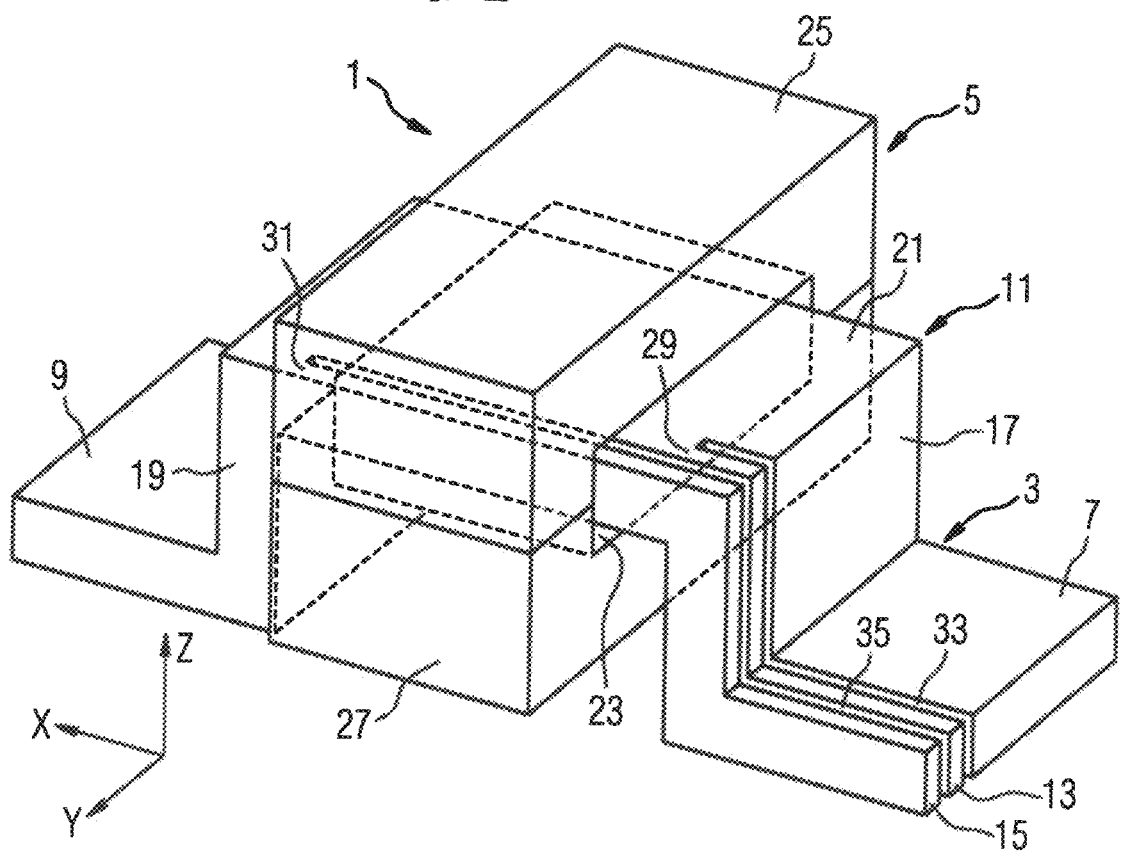
FIG. 2 shows a second perspective representation of the measuring shunt shown in FIG. 1.

FIGS. 1 and 2 show two different perspective representations of an exemplary embodiment of a measuring shunt 1 according to the invention, wherein a Cartesian coordinate system with coordinates X, Y, Z is drawn to clarify the perspectives represented in each case. The measuring shunt 1 has a resistance element 3 and a magnetic core 5.

The resistance element 3 has two main contacts 7, 9, a middle section 11 and two auxiliary contacts 13, 15. The middle section 11 extends between the main contacts 7, 9. The middle section 11 is embodied as U-shaped with two limbs 17, 19 and a central section 21 extending between the limbs 17, 19. Each main contact 7, 9 is angled from one of the legs 17, 19, such that the main contacts 7, 9 protrude from the middle section 11 on opposing sides and directed away from one another.

The magnetic core 5 extends in an annular manner around the central section 21 of the resistance element 3 and is spaced apart from the central section 21 by an air gap 23. The magnetic core 5 consists of two core parts 25, 27 which are joined together and are each embodied as U-shaped. The magnetic core 5 has the shape of a cuboid with an opening, through which the central section 21 of the resistance element 3 extends.

Each auxiliary contact 13, 15 extends from a measurement point 29, 31 in the central section 21 to one end of the resistance element 3 in the region of a first main contact 7. In this case the two measurement points 29, 31 are arranged on different sides of the magnetic core 5. A first auxiliary contact 13 extends from a first measurement point 29 entirely on one side of the magnetic core 5 facing the first main contact 7. The second auxiliary contact 15 extends from the second measurement point 31, which is located on a side of the magnetic core 5 facing the second main contact 9, through the magnetic core 5 to the side of the magnetic core 5 facing the first main contact 7.

The auxiliary contacts 13, 15 of the exemplary embodiment of a measuring shunt 1 shown in FIGS. 1 and 2 are generated by two slots 33, 35 in the resistance element 3, each of which extends through a subsection of the central section 21 and a first limb 17 of the middle section 11 to the end of the resistance element 3 in the region of the first main contact 7. The slots 33, 35 separate the two auxiliary contacts 13, 15 from one another and from the first main contact 7, wherein a first slot 33 separates the first auxiliary contact 13 from the first main contact 7 and the second slot 35 separates the two auxiliary contacts 13, 15 from one another.

The resistance element 3 serves to measure an electrical current which flows between the main contacts 7, 9 through the middle section 11. The electrical current is measured according to the principle of four-wire measurement via an electrical measurement voltage applied between the two measurement points 29, 31, which is tapped at the auxiliary contacts 13, 15.

The magnetic core 5 serves to decouple electronic switches 43 connected in parallel, as in the circuit arrangement 37 shown in FIG. 3.

In alternative exemplary embodiments of the measuring shunt 1, the auxiliary contacts 13, 15 can be embodied in a different manner than in the exemplary embodiment shown in FIGS. 1 and 2. It is essential, however, that one of the two auxiliary contacts 13 or 15 extends through the magnetic core 5 parallel to a direction of flow of an electric current flowing through the resistance element 3. Furthermore, the magnetic core 5 can be embodied in a different manner than in the exemplary embodiment shown in FIGS. 1 and 2. For example, the magnetic core 5 can be injection-molded around the middle section 11 of the resistance element 3, for example from a mixture of a carrier material, for example a plastic, and a magnetic material, for example a magnetic powder.

FIG. 3 shows a circuit diagram of an exemplary embodiment of a circuit arrangement 37 according to the invention with two half-bridges 39, 41 connected in parallel to one another, in each of the bridge arms of which an electronic switch 43 is arranged. A measuring shunt 1 embodied as in FIGS. 1 and 2 is arranged in the bridge arm of each half-bridge 39, 41, with which an electric current 11, 12 flowing in the bridge arm and through the resistance element 3 of the measuring shunt 1 via an electric measuring voltage UI, U2 is measured, which is tapped at the auxiliary contacts 13, 15 of the measuring shunt 1. A first bridge arm of each half-bridge 39, 41 is connected to a first DC line 45 of the circuit arrangement 37. The second bridge arm of each half-bridge 39, 41 is connected to a second DC line 47 of the circuit arrangement 37. The measuring shunts 1 are connected on the output side to an AC line 49 of the circuit arrangement 37. In the exemplary embodiment of a circuit arrangement 37 according to the invention shown in FIG. 3 the electronic switches 43 are insulated gate bipolar transistors (IGBT), but in other exemplary embodiments can also be other semiconductor switches, for example metal oxide semiconductor field-effect transistors (MOSFET).

FIG. 4 shows a circuit diagram of an exemplary embodiment of a power converter 51 according to the invention, The power converter 51 has two converter DC lines 53, 55, three converter AC lines 57 to 59 and three circuit arrangements 37 each embodied as in FIG. 3. The first DC line 45 of each circuit arrangement 37 is connected to a first converter DC line 53. The second DC line 47 of each circuit arrangement 37 is connected to the second converter DC line 55. The AC line 49 of each circuit arrangement 37 is connected to a converter AC line 57 to 59.

Although the invention has been illustrated and described in detail based on preferred exemplary embodiments, the invention is not restricted by the examples given and other variations can be derived therefrom by a person skilled in the art without departing from the protective scope of the invention.

What is claimed is:

1. A measuring shunt, comprising:
a resistance element including a first main contact, a second main contact, and a middle section extending between the first and second main contacts for conducting an electric current between the first and second main contacts through the middle section, said middle section having a U-shaped configuration defining two limbs and a central section extending between the two limbs;
a first measurement point located on the middle section proximate to the first main contact and galvanically connected to the resistance element;
second measurement point located on the middle section proximate to the second main contact and galvanically connected to the resistance element;
a magnetic core extending in an annular manner around the middle section of the resistance element, said magnetic core having a first side facing the first main contact and a second side facing the second main contact;
a first auxiliary contact electrically galvanically connected to the first measurement point; and
a second auxiliary contact electrically galvanically connected to the second measurement point and extending from the second measurement point through the magnetic core to the first side of the magnetic core,
wherein the first and second auxiliary contacts are generated by two slots in the resistance element, with one of the two slots extending through the limb disposed between an end of the resistance element in a region of the first main contact and the first measurement point, and with another slot extending through the limb between the end of the resistance element in the region of first main contact and a subsection of the central section to the second measurement point substantially parallel to the electric current flowing through the subsection.

2. The measuring shunt of claim 1, wherein the first auxiliary contact extends from the first measurement point entirely on the first side of the magnetic core.

3. The measuring shunt of claim 1, wherein the magnetic core includes two core parts which are joined together.

4. The measuring shunt of claim 1, wherein the magnetic core is arranged in spaced-apart relation from the resistance element to define an air gap there between.

5. The measuring shunt of claim 1, wherein the magnetic core is injection-molded around the middle section of the resistance element.

6. A circuit arrangement, comprising:
at least two half-bridges connected in parallel, each of the at least two half-bridges having bridge arms;
an electronic switch arranged in each of the bridge arms of the at least two half-bridges; and
a measuring shunt arranged in the bridge arms of the at least two half-bridges, said measuring shunt comprising a resistance element including a first main contact, a second main contact, and a middle section extending between the first and second main contacts for conducting an electric current between the first and second main contacts through the middle section, said middle section having a U-shaped configuration defining two limbs and a central section extending between the two limbs, a first measurement point located on the middle section proximate to the first main contact and galvanically connected to the resistance element, a second measurement point located on the middle section proximate to the second main contact and galvanically connected to the resistance element, a magnetic core extending in an annular manner around the middle section of the resistance element, said magnetic core having a first side facing the first main contact and a second side facing the second main contact; a first auxiliary contact electrically galvanically connected to the first measurement point, a second auxiliary contact electrically galvanically connected to the second measurement point and extending from the second measurement point through the magnetic core to the first side of the magnetic core, wherein the first and second auxiliary contacts are generated by two slots in the resistance element, with one of the two slots extending through the limb between an end of the resistance element in a region of the first main contact and the first measurement point, and with another slot extending through the limb between the end of the resistance element in the region of first main contact and a subsection of the central section section to the second measurement point substantially parallel to the electric current flowing through the subsection.

7. The circuit arrangement of claim 6, wherein the first auxiliary contact of the measuring shunt extends from the first measurement point entirely on the first side of the magnetic core.

8. The circuit arrangement of claim 6, wherein the magnetic core of the measuring shunt includes two core parts which are joined together.

9. The circuit arrangement of claim 6, wherein the magnetic core of the measuring shunt is arranged in spaced-apart relation from the resistance element to define an air gap there between.

10. The circuit arrangement of claim 6, wherein the magnetic core of the measuring shunt is injection-molded around the middle section of the resistance element.

11. A power converter, comprising a circuit arrangement, said circuit arrangement comprising at least two half-bridges connected in parallel, each of the at least two half-bridges having bridge arms, an electronic switch arranged in each of the bridge arms of the at least two half-bridges, and a measuring shunt arranged in the bridge arms of the at least two half-bridges, said measuring shunt comprising a resistance element including a first main contact, a second main contact, and a middle section extending between the first and second main contacts for conducting an electric current between the first and second main contacts through the middle section, said middle section having a U-shaped configuration defining two limbs and a central section extending between the two limbs, a first measurement point located on the middle section proximate to the first main contact and galvanically connected to the resistance element, a second measurement point located on the middle section proximate to the second main contact and galvanically connected to the resistance element, a magnetic core extending in an annular manner around the middle section of the resistance element, said magnetic core having a first side facing the first main contact and a second side facing the second main contact; a first auxiliary contact electrically galvanically connected to the first measurement point, a second auxiliary contact electrically galvanically connected to the second measurement point and extending from the second measurement point through the magnetic core to the first side of the magnetic core, wherein the first and second auxiliary contacts are generated by two slots in the resistance element, with one of the two slots extending through the limb between an end of the resistance element of the first main contact and the first measurement point, and with another slot extending through the limb between the end of the resistance element in the region of first main contact and a subsection of the central section to the second measurement point substantially parallel to the electric current flowing through the subsection.

12. The power converter of claim 11, wherein the first auxiliary contact of the measuring shunt extends from the first measurement point entirely on the first side of the magnetic core.

13. The power converter of claim 11, wherein the magnetic core of the measuring shunt includes two core parts which are joined together.

14. The power converter of claim 11, wherein the magnetic core of the measuring shunt is arranged in spaced-apart relation from the resistance element to define an air gap there between.

15. The power converter of claim 11, wherein the magnetic core of the measuring shunt is injection-molded around the middle section of the resistance element.

* * * * *